United States Patent
Hou et al.

(10) Patent No.: US 6,222,221 B1
(45) Date of Patent: Apr. 24, 2001

(54) CROSS-COUPLED CAPACITORS FOR IMPROVED VOLTAGE COEFFICIENT

(75) Inventors: Chin-Shan Hou; Ming-Jer Chen, both of Hsinchu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/439,356

(22) Filed: Nov. 15, 1999

Related U.S. Application Data

(62) Division of application No. 08/953,530, filed on Oct. 20, 1997.

(51) Int. Cl.⁷ .......... H01L 27/108; H01L 29/76; H01L 29/94; H01L 31/119
(52) U.S. Cl. .......... 257/307; 257/306; 438/253
(58) Field of Search .......... 257/307, 297, 257/296, 306; 438/250, 253

(56) References Cited

U.S. PATENT DOCUMENTS

| | | | |
|---|---|---|---|
| 4,731,696 | 3/1988 | Himes et al. | 361/313 |
| 4,878,151 * | 10/1989 | Gallichio | 361/329 |
| 5,016,070 | 5/1991 | Sundaresan | 357/23.6 |
| 5,208,597 * | 5/1993 | Early et al. | 341/172 |
| 5,347,152 | 9/1994 | Sundaresan | 257/304 |
| 5,389,832 | 2/1995 | Boerstler et al. | 327/223 |
| 5,470,775 * | 11/1995 | Nariani | 437/52 |
| 5,521,111 | 5/1996 | Sato | 437/52 |

* cited by examiner

*Primary Examiner*—Steven Loke
*Assistant Examiner*—Douglas W. Owens
(74) *Attorney, Agent, or Firm*—George O. Saile; Stephen B. Ackerman

(57) ABSTRACT

A capacitor having a low voltage coefficient, even though one electrode is a semiconductor and one is a metal, is described. Two parallel plate capacitors are formed side by side and then cross-connected. The bottom plate of one of the capacitors is connected to the top plate of the other capacitor, and vice versa. This arrangement causes the two capacitors to be polarized in opposite directions at all times so that the individual voltage coefficients cancel each other and give the combined structure a value that is about 2 ppm V. A process for manufacturing this capacitor is also described.

8 Claims, 3 Drawing Sheets

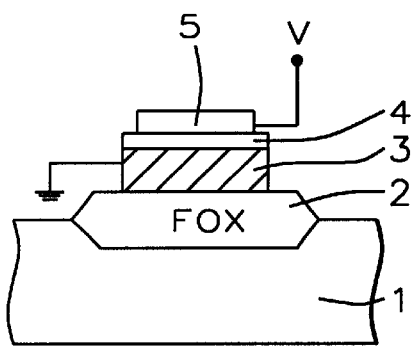
FIG. 1 – Prior Art
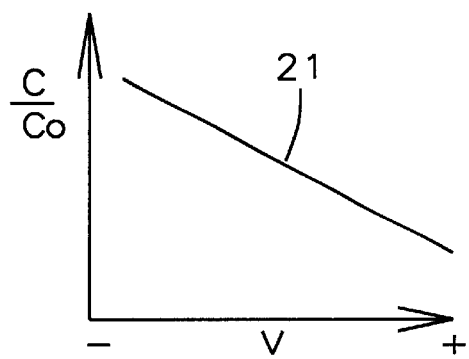
FIG. 2 – Prior Art
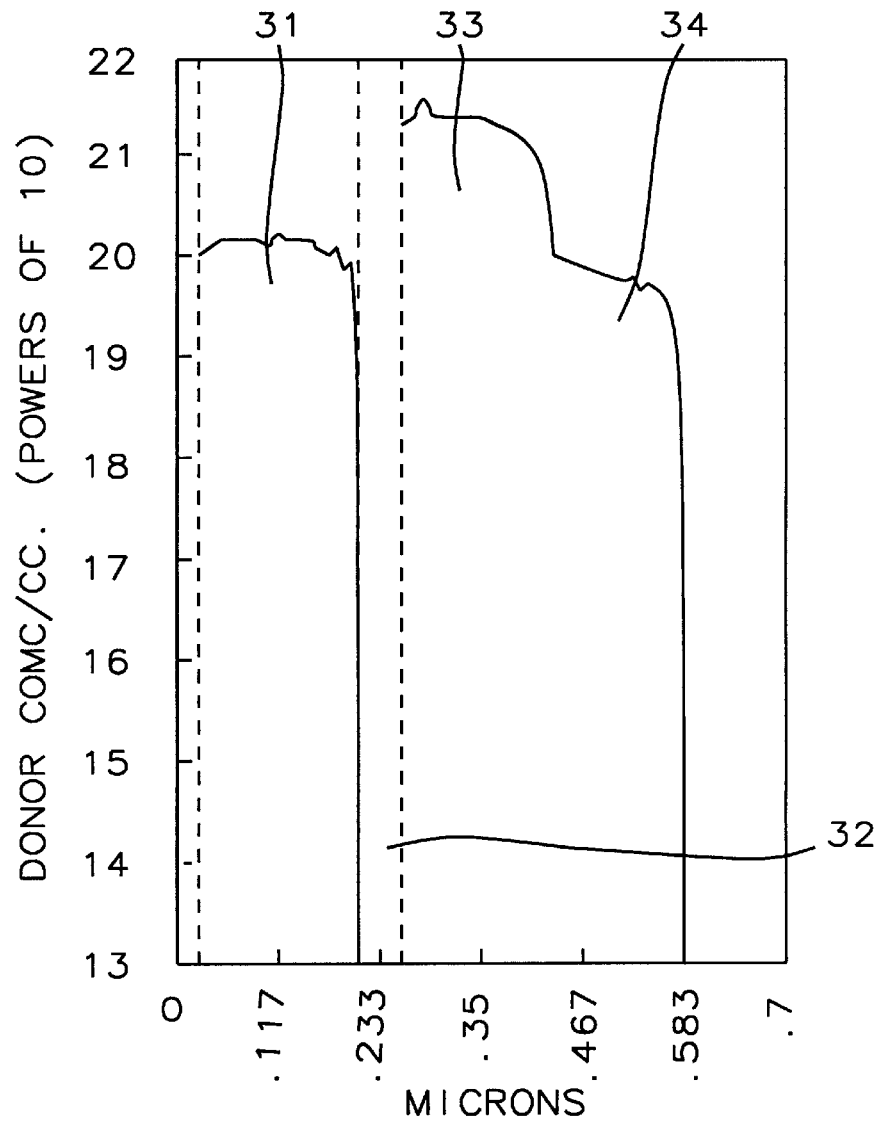
FIG. 3 – Prior Art

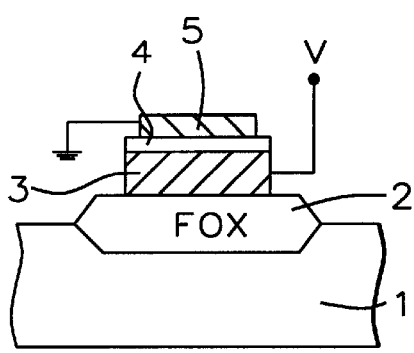
*FIG. 4 - Prior Art*
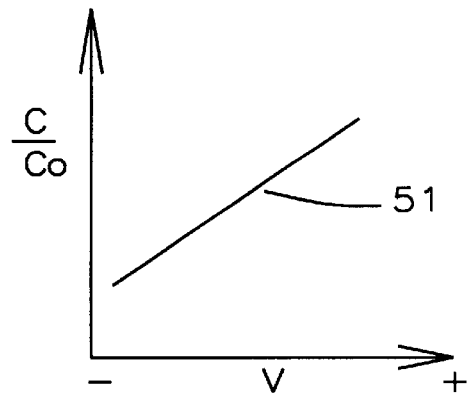
*FIG. 5 - Prior Art*
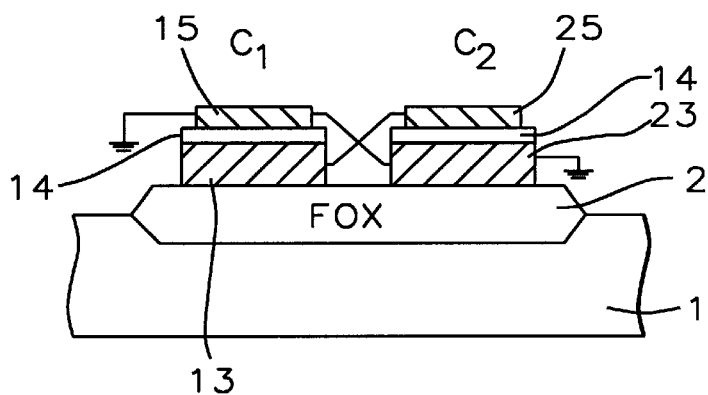
*FIG. 6*
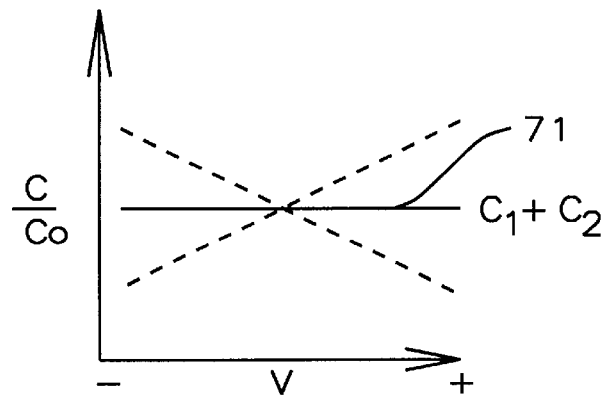
*FIG. 7*

CROSS-COUPLED CAPACITORS FOR IMPROVED VOLTAGE COEFFICIENT

This is a division of patent application Ser. No. 08/953,530, filing date Oct. 20, 1997, Cross-Coupled Capacitors For Improved Voltage Coefficient, assigned to the same assignee as the present invention.

BACKGROUND OF THE INVENTION (1) Field of the Invention

The invention relates to the general field of electrical capacitors, more particularly to low voltage-coefficient capacitors in integrated circuits.

(2) Description of the Prior Art

As is well known, the capacitance of a parallel plate capacitor is normally a function only of the area of the electrodes, the dielectric constant of the dielectric and the thickness of the dielectric. This assumes that both electrodes are metallic conductors. If one of the electrodes is a semiconductor, a depletion region, extending into the semiconductor, is formed at the semiconductor-dielectric interface, even in the absence of any externally applied voltage bias, thereby rendering the capacitance of such a structure somewhat lower than if both electrodes had been metallic.

An important consequence of this phenomenon is that when voltage is applied across the above described device's plates, the depletion layer in the semiconductor grows or shrinks, depending on the polarity, thereby reducing or increasing the measured capacitance. In other words, such a device has a high voltage coefficient, in some cases as high as 120 ppm/volt. In many integrated circuits this is not a problem but in many analog circuits (such as analog to digital converters, for example) this cannot be tolerated.

During the manufacture of integrated circuits where capacitors must be included it is obviously an advantage if such capacitors do not take up real estate needed for other devices, notably transistors. Fortunately, the areas of field oxide that are used to electrically isolate active devices from one another, are available for this. It is also particularly advantageous if the capacitors can be formed without introducing any additional steps into an existing process, other than the modification of the etch masks. With this in mind, it has been common practice to form capacitors in integrated circuits by sandwiching a layer of the silicon oxide known as IPO (or inter-poly oxide) between two layers of polysilicon.

In earlier processes such as the standard 0.5 micron mixed-mode process, the two polysilicon layers used for the capacitors were sufficiently heavily doped so that they were electrically degenerate (that is, they exhibited metallic conductivity) and any depletion layer formed at the silicon-dielectric interface would be negligibly thin. More recently, with the development of the 0.35 micron process, changes in processing parameters make the polysilicon layers less heavily doped. This is unimportant for the first layer of polysilicon (poly1) because a layer of tungsten silicide, which is a metallic conductor, is formed on poly1 so it has a depletion free interface with the IPO.

There is no corresponding layer of tungsten silicide between poly2 and the IPO, so a depletion layer forms within the poly2 and the resulting capacitor has a high voltage coefficient. Referring now to FIG. 1, we show a schematic cross-section of such a capacitor. Bottom electrode 3, comprising poly1, has been formed on an area 2 of field oxide on silicon substrate 1. Dielectric layer 4, comprising IPO, lies on top of 3 and layer 5, comprising poly2, forms the top electrode.

FIG. 2 shows a schematic plot of the normalized capacitance value of the device of FIG. 1 as a function of applied voltage V. Typically, V covers the range of from −5 to +5 volts, with V applied to the poly2 layer and the poly1 layer being grounded. The voltage coefficient of capacitance, as defined by the slope of curve 21 is generally about −120 ppm/volt.

A number of prior art references describe capacitors for incorporation within integrated circuits but most do not address the voltage coefficient issue. Boerstler et al. (U.S. Pat. No. 5,389,832 February 1995) describe capacitors formed from forward biassed diodes. Sundaresan (U.S. Pat. No. 5,016,070 May 1991) describes a stacked CMOS SRAM with cross-coupled capacitors. Sato (U.S. Pat. No. 5,521,111 May 1996) teaches use of a trench-stacked capacitor.

Himes et al. (U.S. Pat. No. 4,731,696 March 1988) address the voltage coefficient issue and disclose a three plate capacitor structure wherein two layers of dielectric are sandwiched between three conductive plates, the center plate being the semiconductor. Voltage is applied between the center plate and the two outer plates (which are connected to each other). Since the upper and lower capacitors always see opposed electric vectors the voltage coefficients in the upper and lower dielectric layers will always carry opposite signs and will thus tend to cancel one another.

While this structure should exhibit low voltage coefficient, it requires three separate deposition steps for the electrodes and two separately deposited dielectric layers. The latter limitation can lead to serious problems in the absence of precise thickness and process control during deposition of the two dielectric layers. It also means that the standard manufacturing process will have to be modified if this structure is to be made part of an integrated circuit.

SUMMARY OF THE INVENTION

It has been an object of the present invention to provide a capacitor that has a very low voltage-coefficient.

A further object of the invention has been that said capacitor be part of an integrated circuit.

Another object of the invention has been to provide a process for manufacturing such a capacitor.

A still further object of the invention has been that said process be part of a standard process already in place for manufacturing integrated circuits and that no additional steps, other than modified etch patterns, need be introduced into said standard process.

These objects have been achieved by forming two parallel plate capacitors side by side on an area of field oxide and then cross-connecting them. The bottom plate of one of the capacitors is connected to the top plate of the other capacitor, and vice versa. This arrangement causes the two capacitors to be polarized in opposite directions at all times so that the individual voltage coefficients cancel each other and give the combined structure a value that is 2 ppm/V.

BRIEF DESCRIPTION OF THE DRAWINGS

FIG. 1 is a cross-section of a capacitor formed between two layers of polysilicon within an integrated circuit.

FIG. 2 is an idealized curve of capacitance vs. voltage for the structure of FIG. 1.

FIG. 3 shows donor concentration/cc. taken through a cross-section of a capacitor such as the one shown in FIG. 1

FIG. 4 is similar to FIG. 1 except that the polarity of the applied voltage has been reversed.

FIG. 5 is an idealized curve of capacitance vs. voltage for the structure of FIG. 4.

FIG. 6 is a cross-sectional view of two capacitors connected according to the teachings of the present invention.

FIG. 7 is an idealized curve of capacitance vs. voltage for the structure of FIG. 6.

DESCRIPTION OF THE PREFERRED EMBODIMENTS

Figure 8:
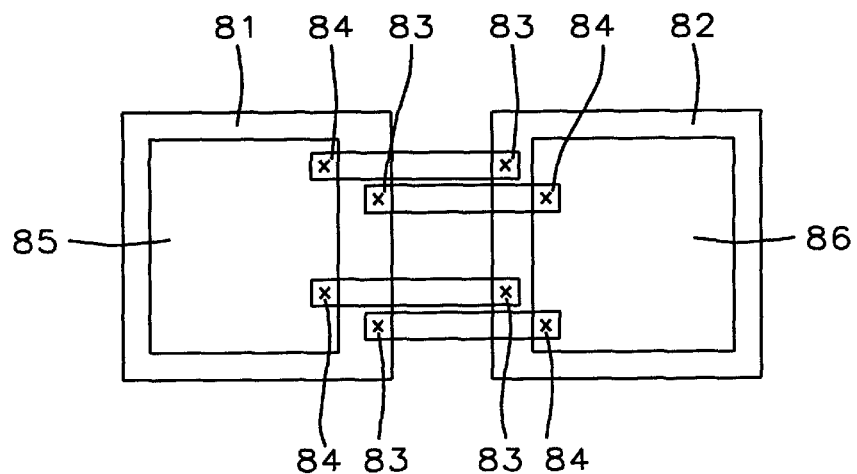
FIGS. 8 and 9 are plan views that show how connections are made between the two capacitors.

Referring now to FIG. 3, we show there a plot of donor concentration (expressed as powers of 10) per cc. as a function of distance along a cross-section of a capacitor that would be formed if the standard 0.35 micron process is used without any modification. Region 31 represents the top plate which is a layer of poly2. As can be seen, the donor (electron) density in the poly2 is about $10^{20}$ per cc. The resistivity of region 31 is about 0.8 mohm-cm. which is too high for metallic conduction.

Region 32 is the dielectric layer comprising IPO about 400 Angstroms thick. Region 33 is the beginning of the bottom plate and comprises tungsten silicide. The electron density in region 33 is about 12× greater than in region 31, implying metallic conduction. The resistivity in region 33 is less than about 0.1 mohm-cm. Region 34 is poly1 which is seen to be similar to poly2.

FIG. 4 is identical to FIG. 1 except that V is applied to the poly1 layer while poly2 layer 5 is now grounded. The result is that the plot of normalized capacitance vs. voltage now has the form of curve 51 which can be seen to be equal to but opposite in sign to curve 21 of FIG. 2.

Since the two capacitors seen in FIGS. 1 and 4 have oppositely signed voltage coefficients, connecting two such capacitors in parallel will result in a single capacitor having double the capacitance and a voltage coefficient close to zero. This is illustrated in FIG. 6 where poly1 bottom plate 13 is seen to be connected to poly2 top plate 25 while poly1 bottom plate 23 is connected to poly2 top plate 15. To operate the capacitor, top plate 15 and/or bottom plate 23 is grounded and voltage is applied to bottom plate 13 and/or top plate 25.

Curve 71 in FIG. 7 shows how the normalized capacitance of the structure seen in FIG. 6 varies with voltage. As expected, the two curves associated with the capacitors measured separately cancel each other and a voltage coefficient close to zero is obtained.

The first, and most general, embodiment of the present invention is thus two capacitors, formed from the same materials and having the same capacitance values, in which the top plate of each capacitor is connected to the bottom plate of the other capacitor, and vice versa. Although the invention will operate for any capacitor type it is of most value if the top plates are formed of a semiconducting material while the the bottom plates are metal. The invention will work for a wide range of dielectrics, including silicon oxide, silicon nitride, and tantalum oxide.

The second embodiment of the invention relates to capacitors for use within integrated circuits. As we describe a process for manufacturing this embodiment its structure will become clear.

We assume that the integrated circuit of which the capacitor is to be a part is partially complete when manufacture of the capacitors begins. In particular, areas of field oxide will exist and be available as locations for the capacitors and the next step in the regular manufacturing process is the deposition of the first layer of polysilicon (poly1). Typically, the poly1 will be about 0.15 microns thick, but any thickness between about 0.1 and 0.3 microns would still work. The process that we have used for depositing poly1 has been in-situ doped CVD, chemical vapor deposition, (at about 570° C.) of dichlorosilane (DCS), but any similar process would still be acceptable. The resistivity of the poly1 layer is between about 0.6 and 1 mohm-cm.

As part of separate processing step involving the deposition of tungsten, a layer of tungsten suicide is formed on the top surface of poly1. The resistivity of the tungsten silicide is between about 90 and 130 micro-ohm-cm, so it exhibits metallic conductivity. Other suicides, such as titanium silicide or cobalt silicide could also have been used without reducing the effectiveness of the invention.

Using standard photolithographic techniques, poly1, including the tungsten silicide, is etched into the shape of two bottom electrodes such as 81 and 82 in FIG. 8. These electrodes are typically rectangular in shape, measuring between about 20 and 500 by between 20 and 500 microns and having areas between about 400 and 250,000 sq. microns. They are adjacent to one another and are separated by between about 0.6 and 20 microns.

A dielectric (which is not explicitly shown in FIG. 8 but which corresponds to layer 14 in FIG. 6) is then laid down so as to cover both bottom plates. Our preferred choice for the dielectric has been silicon oxide (IPO) which is formed by high temperature oxidation at around 800° C., but the invention would still operate satisfactorily if other dielectric materials such as thermal oxide, oxide-nitride-oxide (ONO), silicon nitride, tetraethoxyorthosilicate (TEOS), or tantalum oxide were to be substituted. A typical thickness for this layer would be about 370 Angstroms, but any thickness between about 200 and 500 Angstroms would be acceptable.

Contact holes such as 83 (marked by Xs) are then etched in this dielectric layer so as to expose for future access the tungsten silicide.

Next, the poly2 layer is deposited by in-situ doping of poly from CVD of DCS and etched to form top plates 85 and 86. Typically, poly2 is about 1,800 Angstroms thick but any thickness between about 1,000 and 3,000 microns would be acceptable.

Plates 85 and 86 overlie, but do not overlap, bottom plates 81 and 82 and they leave contact holes 83 clear.

To complete this embodiment, a layer of a conductive material such as aluminum, gold, tungsten, copper, aluminum-copper, and aluminum-silicon-copper (which would also be used to form wiring in other parts of the integrated circuit) is laid down to a thickness between about 3,000 and 5,000 Angstroms and then etched to form connections between contact or via holes 83 on the bottom electrodes and contact points 84 on the top electrodes, leading to the structure shown schematically in FIG. 6. The resulting capacitor has a capacitance of about 283 pF for a 300×500 micron pair of plates and a voltage coefficient of capacitance that is less than about 2 ppm/V.

Figure 9:
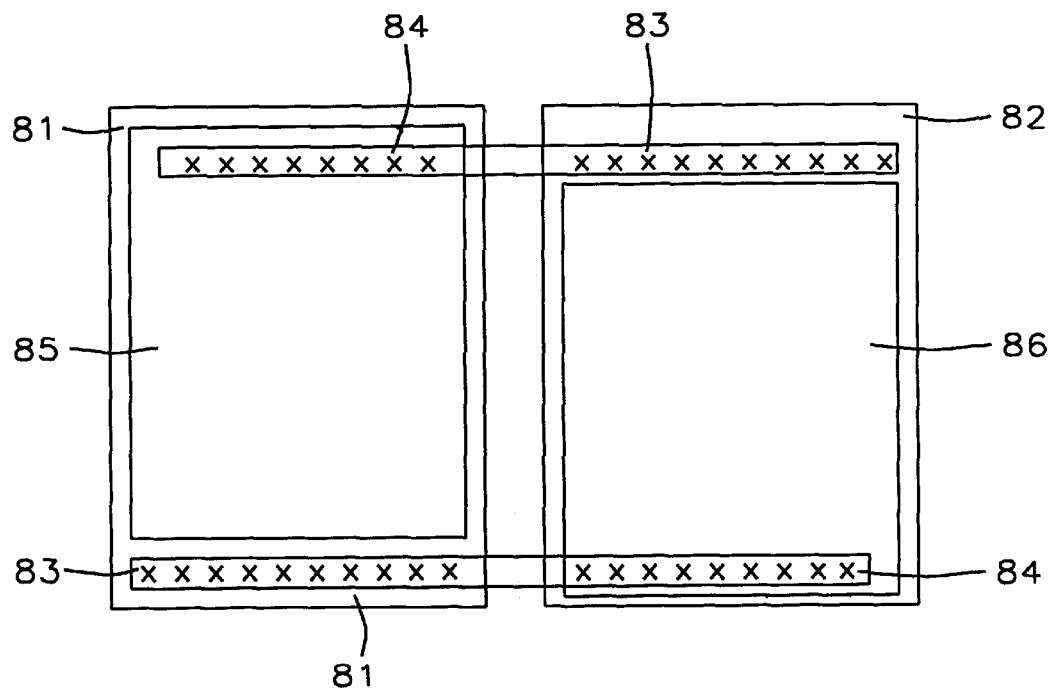

FIG. 9 illustrates a variation on the connection scheme that may be used to connect the two capacitors. As in FIG. 9, contact or via holes 83 allow contact to be made to bottom electrodes 81 and 82 and contact points 84 show where connection is made to top plates 85 and 86.

While the invention has been particularly shown and described with reference to the preferred embodiments thereof, it will be understood by those skilled in the art that various changes in form and details may be made without departing from the spirit and scope of the invention.

What is claimed is:

1. A low voltage coefficient capacitor, in an integrated circuit, comprising:
   on an area of field oxide, first and second bottom electrodes of a first layer of polysilicon, said polysilicon having metallic conduction;
   a layer of a dielectric covering both the first and second bottom electrodes;
   contact holes in the dielectric layer;
   first and second top electrodes of a second layer of polysilicon, said polysilicon having semiconductive conduction, each top electrode overlying a bottom electrode while leaving said contact holes clear;
   thin film wiring extending from the first bottom electrode, through the contact holes, to the second top electrode;
   thin film wiring extending from the second bottom electrode, through the contact holes, to the first top electrode;
   no insulation between the thin film wiring and the bottom electrodes, other than said dielectric layer.

2. The capacitor of claim 1 wherein the first layer of polysilicon has a resistivity between about 0.6 and 1 mohm-cm.

3. The capacitor of claim 1 further comprising a layer of a silicide, selected from the group consisting of tungsten silicide, titanium silicide, and cobalt silicide, between the first layer of polysilicon and the dielectric.

4. The capacitor of claim 1 wherein each bottom electrode has an area between about 400 and 250,000 sq. microns.

5. The capacitor of claim 4 wherein the bottom electrodes are adjacent to one another and separated by between about 0.6 and 20 microns.

6. The capacitor of claim 1 wherein said dielectric is selected from the group consisting of high temperature oxide, thermal oxide, oxide-nitride-oxide, silicon nitride, tetraethoxyortho-silicate, or tantalum oxide.

7. Claim 1 wherein the capacitor has a capacitance of about 283 pF for a 300×500 micron pair of plates.

8. Claim 1 wherein the capacitor has a voltage coefficient of capacitance that is less than about 2 ppm/V.

* * * * *